US011152598B2

(12) United States Patent
Choi et al.

(10) Patent No.: US 11,152,598 B2
(45) Date of Patent: Oct. 19, 2021

(54) ELECTROLUMINESCENT DISPLAY DEVICE

(71) Applicant: LG Display Co., Ltd., Seoul (KR)

(72) Inventors: Yong-Hoon Choi, Paju-si (KR); Won-Hoe Koo, Paju-si (KR); Woo-Ram Youn, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/905,799

(22) Filed: Jun. 18, 2020

(65) Prior Publication Data

US 2020/0321557 A1  Oct. 8, 2020

Related U.S. Application Data

(62) Division of application No. 16/198,205, filed on Nov. 21, 2018, now Pat. No. 10,727,447.

(30) Foreign Application Priority Data

Nov. 30, 2017  (KR) .......................... 10-2017-0163172

(51) Int. Cl.
*H01L 51/52*     (2006.01)
*H01L 27/32*     (2006.01)
*H01L 51/50*     (2006.01)

(52) U.S. Cl.
CPC ...... *H01L 51/5271* (2013.01); *H01L 27/3248* (2013.01); *H01L 27/3258* (2013.01); *H01L 27/3262* (2013.01); *H01L 51/5012* (2013.01); *H01L 51/5218* (2013.01); *H01L 51/5234* (2013.01); *H01L 51/5237* (2013.01)

(58) Field of Classification Search
None
See application file for complete search history.

(56) References Cited

U.S. PATENT DOCUMENTS 5,554,911 A * 9/1996 Nakayama .......... H01L 51/5036
  313/503
2006/0001091 A1‡ 1/2006 Kim ....................... H01L 27/12
  257/347

(Continued)

FOREIGN PATENT DOCUMENTS

JP  2007-173200   ‡ 7/2007
JP  2007-173200 A   7/2007

(Continued)

*Primary Examiner* — Ashok Patel
(74) *Attorney, Agent, or Firm* — Seed IP Law Group LLP

(57) ABSTRACT

An electroluminescent display device includes a thin film transistor disposed on a substrate; a passivation layer disposed on the thin film transistor; a plurality of metallic patterns disposed to be spaced apart from each other on the passivation layer; a reflective electrode disposed conforming to the shapes of the plurality of metallic patterns and a top surface of the passivation layer and including a plurality of protruding portions; an overcoat layer disposed on the passivation layer and the reflective electrode and including an opening configured to expose a top surface of each of the plurality of protruding portions; a first electrode disposed on the reflective electrode and the overcoat layer and electrically connected to the reflective electrode; an light-emitting layer disposed on the first electrode; and a second electrode disposed on the light-emitting layer.

14 Claims, 9 Drawing Sheets

(56) References Cited

U.S. PATENT DOCUMENTS

2009/0294785 A1* 12/2009 Cok .................. H01L 51/5262
  257/98
2015/0188095 A1* 7/2015 Yoo .................. H01L 27/3246
  257/40
2017/0177125 A1‡ 6/2017 Kim .................. G06F 3/0412
2019/0074464 A1‡ 3/2019 Koike et al. .......... H05B 33/06

FOREIGN PATENT DOCUMENTS

WO   2017/094760 A1 ‡  6/2017
WO   2017/094760 A1    6/2017

\* cited by examiner
‡ imported from a related application

ELECTROLUMINESCENT DISPLAY DEVICE

CROSS-REFERENCE TO RELATED APPLICATION(S)

This application claims the benefit under 35 U.S.C. § 119(a) of Korean Patent Application No. 10-2017-0163172, filed on Nov. 30, 2017, in the Korean Intellectual Property Office, which is incorporated herein by reference in its entirety.

BACKGROUND

Technical Field

The present disclosure relates to an electroluminescent display device, and more particularly, to an electroluminescent display device capable of improving light extraction efficiency and widening a viewing angle.

Description of the Related Art

In recent years, flat panel displays having excellent characteristics such as being thin, lightweight, and having low power consumption have been widely developed and applied to various fields.

Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed, and then radiative recombination of the excitons occurs, thereby emitting light.

The electroluminescent display device can be formed using a flexible substrate such as plastic because it is self-luminous, and has excellent contrast ratios. Further the electroluminescent display device has a response time of several micro seconds, and there are advantages in displaying moving images. The electroluminescent display device also has wide viewing angles and is stable under low temperatures. Since the electroluminescent display device is driven by a low voltage of direct current DC 5V to 15V, it is easy to design and manufacture driving circuits.

FIG. 1 is a schematic cross-sectional view of a related art electroluminescent display device.

As illustrated in FIG. 1, an electroluminescent display device 1 includes a substrate 10, a thin film transistor Tr disposed on the substrate 10, and a light-emitting diode D disposed on the substrate 10 and connected to the thin film transistor Tr. An encapsulation layer (not shown) may be disposed on the light-emitting diode D.

The light-emitting diode D includes a first electrode 41, a light-emitting layer 42, and a second electrode 43, wherein light from the light-emitting layer 42 is output to the outside through the second electrode 43.

The light emitted from the light-emitting layer 42 passes through various configurations of the electroluminescent display device 1 and output toward an upper portion of the electroluminescent display device 1.

However, an optical waveguide mode which is configured by a surface plasmon component generated at a boundary between a metal and the light-emitting layer 42 and the light-emitting layer 42 inserted between reflective layers at both sides accounts for about 60 to 70% of emitted light.

Accordingly, among light emitted from the light-emitting layer 42, rays of light that are trapped in the electroluminescent display device 1 instead of exiting the electroluminescent display device 1 are present. Thus, there is a problem in that light extraction efficiency of the electroluminescent display device 1 is degraded.

BRIEF SUMMARY

Accordingly, embodiments of the present disclosure are directed to an electroluminescent display device that substantially obviates one or more of the problems due to limitations and disadvantages of the related art.

It is an object of the present disclosure to provide an electroluminescent display device that is able to improve light extraction efficiency and widen a viewing angle.

To achieve the above-described object, the present disclosure provides an electroluminescent display device including a thin film transistor disposed on a substrate; a passivation layer disposed on the thin film transistor; a plurality of metallic patterns disposed to be spaced apart from each other on the passivation layer; a reflective electrode disposed conforming to the shapes of the plurality of metallic patterns and a top surface of the passivation layer and including a plurality of protruding portions; an overcoat layer disposed on the passivation layer and the reflective electrode and including an opening configured to expose a top surface of each of the plurality of protruding portions; a first electrode disposed on the reflective electrode and the overcoat layer and electrically connected to the reflective electrode; an light-emitting layer disposed on the first electrode; and a second electrode disposed on the light-emitting layer.

In another aspect, an electroluminescent display device includes a substrate including one or more pixels; and a light-emitting structure disposed in each of the pixels, wherein the light-emitting structure comprises a second electrode, a reflective electrode, and a light-emitting layer disposed between the second electrode and the reflective electrode, or comprises a second electrode, a reflective electrode, a light-emitting layer disposed between the second electrode and the reflective electrode, and a first electrode disposed between the light-emitting layer and the reflective electrode, wherein each of the pixels comprises a plurality of micro cavity areas disposed to be spaced apart from each other and one or more non-micro cavity area disposed between the micro cavity area, a combined thickness in a vertical direction of the light-emitting structure from the reflective electrode to the second electrode has a different value in the micro cavity area from that in the non-micro cavity area, and the light-emitting structure is configured to produce a micro cavity effect, and wherein each of the second electrode and the reflective electrode is formed to be flat in the micro cavity area and at least one of the second electrode and the reflective electrode is formed to comprise a non-flat surface in the non-micro cavity area or wherein each of the first electrode, the second electrode, and the reflective electrode is formed to be flat in the micro cavity area and at least one of the first electrode, the second electrode, and the reflective electrode is formed to comprise a non-flat surface in the non-micro cavity area.

It is to be understood that both the foregoing general description and the following detailed description are by example and explanatory, and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain various principles of the present disclosure. In the drawings.

DETAILED DESCRIPTION

Hereinafter, exemplary embodiments of the present disclosure will be described with reference to the accompanying drawings.

Figure 1:
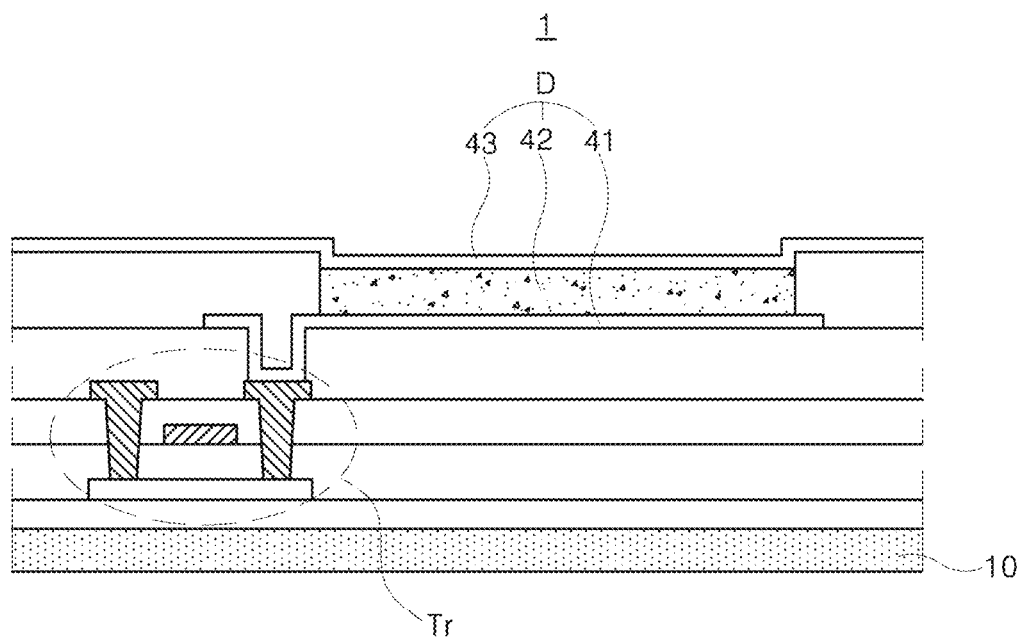
FIG. 1 is a cross-sectional view schematically illustrating a related art electroluminescent display device.
Figure 2:
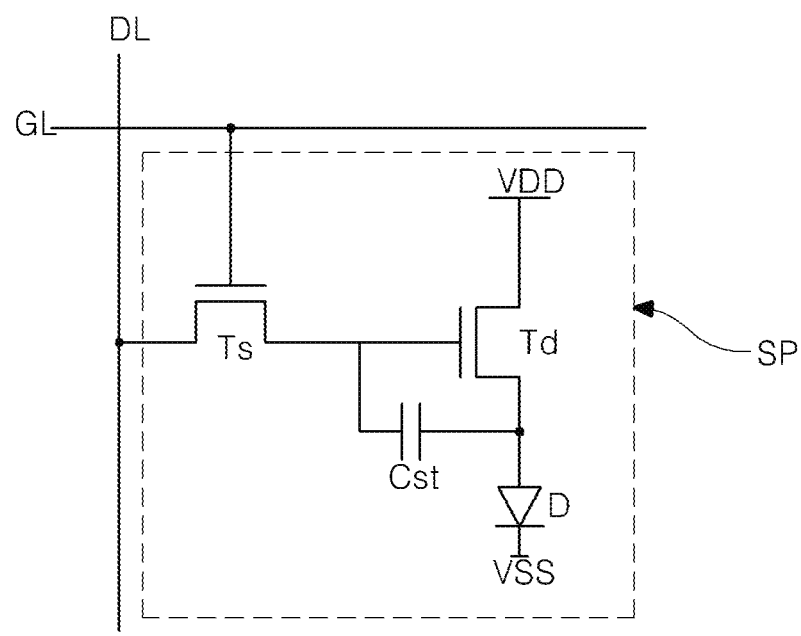
FIG. 2 is a circuit diagram illustrating a single subpixel area of an electroluminescent display device according to an embodiment of the present disclosure.

FIG. 2 is a circuit diagram illustrating a single subpixel area of an electroluminescent display device according to an embodiment of the present disclosure.

As illustrated in FIG. 2, the electroluminescent display device according to the embodiment of the present disclosure includes a gate line GL, a data line DL, a switching thin film transistor Ts, a driving thin film transistor Td, a storage capacitor Cst and a light-emitting diode D. The gate line GL and the data line DL cross each other to define a subpixel area SP. The switching thin film transistor Ts, the driving thin film transistor Td, the storage capacitor Cst and the light-emitting diode D are formed in the subpixel area SP.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light-emitting diode D is connected to a drain electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

That is, the amount of the current flowing through the light-emitting diode D is proportional to the magnitude of the data signal, and the intensity of light emitted by the light-emitting diode D is proportional to the amount of the current flowing through the light-emitting diode D. Thus, subpixel areas SP show different gray levels depending on the magnitude of the data signal, and as a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame.

A transistor and/or a capacitor other than the switching and driving thin film transistors Ts and Td and the storage capacitor Cst may be further added in the subpixel area SP.

Figure 3:
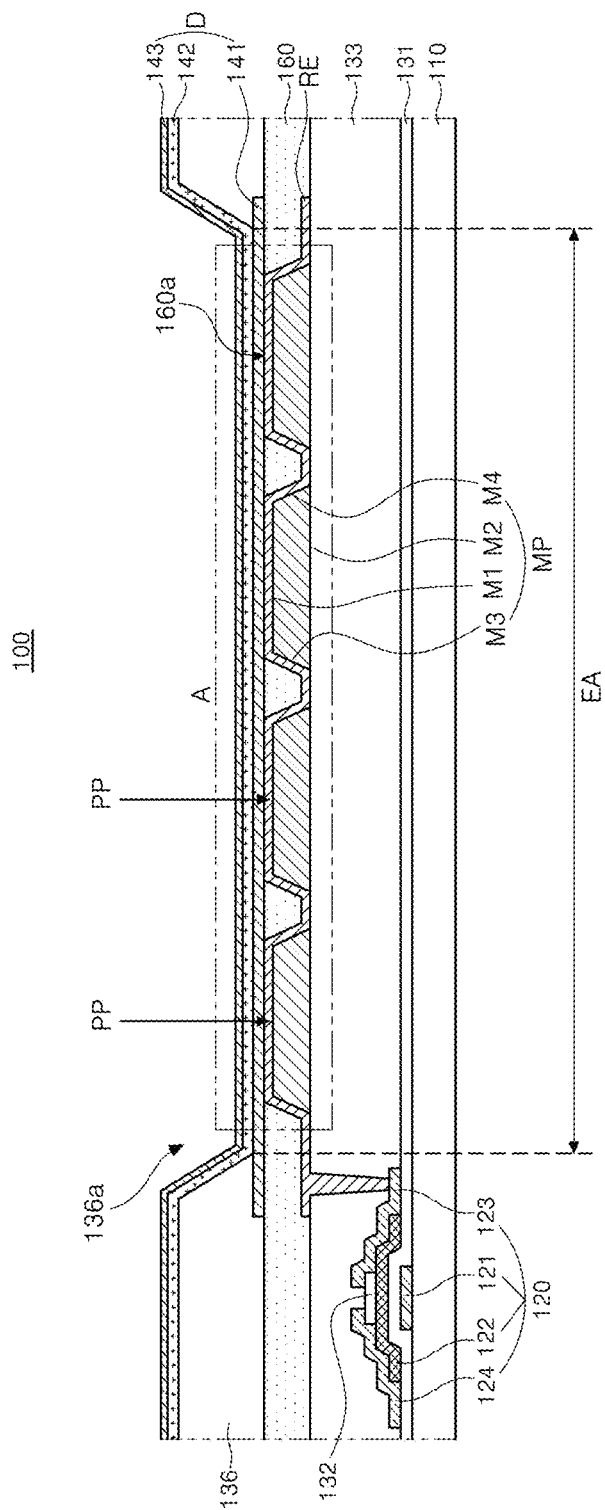
FIG. 3 is a cross-sectional view schematically illustrating the electroluminescent display device according to an embodiment of the present disclosure.

FIG. 3 is a cross-sectional view schematically illustrating the electroluminescent display device according to an embodiment of the present disclosure.

As illustrated in FIG. 3, an electroluminescent display device 100 according to the embodiment of the present disclosure may include a first substrate 110, a thin film transistor 120, a plurality of metallic patterns MP, a reflective electrode RE, an overcoat layer 160, and a light-emitting diode D.

The electroluminescent display device 100 according to the embodiment of the present disclosure is illustrated as being a top emission type in which light from a light-emitting layer 142 is output to the outside through a second electrode 143, but embodiments are not limited thereto.

The electroluminescent display device 100 according to the embodiment of the present disclosure may include a thin film transistor 120 which includes a gate electrode 121, an active layer 122, a source electrode 123, and a drain electrode 124 on the first substrate 110.

Specifically, the gate electrode 121 of the thin film transistor 120 and a gate insulation layer 131 may be disposed on the first substrate 110.

The active layer 122, which overlaps the gate electrode 121, may be disposed on the gate insulation layer 131.

An etch stopper 132 for protecting a channel region of the active layer 122 may be disposed on the active layer 122.

The source electrode 123 and the drain electrode 124 may be disposed on the active layer 122 and contact the active layer 122.

The electroluminescent display device to which the embodiment of the present disclosure is applicable is not limited to that illustrated in FIG. 3. The electroluminescent display device may further include a buffer layer disposed between the first substrate 110 and the active layer 122, and the etch stopper 132 may not be disposed thereon.

For convenience of description, only the driving thin film transistor has been illustrated from among various thin film transistors that may be included in the electroluminescent display device 100. Although the thin film transistor 120 will be described as having an inverted staggered structure or bottom gate structure in which the gate electrode 121 is disposed at an opposite side of the source electrode 123 and the drain electrode 124 with respect to the active layer 122, this is merely an example, and a thin film transistor having a coplanar structure or top gate structure in which the gate electrode 121 is disposed at the same side as the source electrode 123 and the drain electrode 124 with respect to the active layer 122 may also be used.

A passivation layer 133 may be disposed on the drain electrode 124 and the source electrode 123.

In this case, although the passivation layer 133 is illustrated as flattening an upper portion of the thin film transistor 120, the passivation layer 133 may also be disposed along the shapes of surfaces of elements located below the passivation layer 133 instead of flattening the upper portion of the thin film transistor 120.

A plurality of metallic patterns MP which are spaced apart from each other may be disposed on the passivation layer 133 in an emissive area EA of the electroluminescent display device 100 according to the embodiment of the present disclosure.

That is, the plurality of metallic patterns MP spaced apart from each other may be disposed in the emissive area EA, and the passivation layer 133 may be exposed between adjacent metallic patterns MP.

In this case, emissive area EA refers to an area in which the light-emitting layer 142 emits light by the first electrode 141 and the second electrode 143.

Each of the plurality of metallic patterns MP may be formed of a single layer or multiple layers formed of copper (Cu), molybdenum (Mo), titanium (Ti), or an alloy thereof, but embodiments are not limited thereto.

The plurality of metallic patterns MP may have a trapezoidal cross-section, but embodiments are not limited thereto.

In the electroluminescent display device 100 according to the embodiment of the present disclosure, the reflective electrode RE may be disposed conforming to the shapes of the plurality of metallic patterns MP and a top surface of the passivation layer 133.

That is, the reflective electrode RE may include a plurality of protruding portions PP formed conforming to the shapes of the plurality of metallic patterns MP.

A top surface of each of the plurality of protruding portions PP may be formed to be flat.

The reflective electrode RE may be formed of an APC alloy, but embodiments are not limited thereto.

The APC alloy refers to an alloy of silver (Ag), palladium (Pd), and copper (Cu).

The reflective electrode RE may be connected to the source electrode 123 of the thin film transistor 120 through a contact hole formed in the passivation layer 133. However, embodiments are not limited thereto, and the first electrode 141 on the reflective electrode RE may be connected to the source electrode 123 of the thin film transistor 120.

The electroluminescent display device 100 according to the embodiment of the present disclosure has been described as an example in which the thin film transistor 120 is an N-type thin film transistor and the reflective electrode RE is connected to the source electrode 123, but embodiments are not limited thereto. When the thin film transistor 120 is a P-type thin film transistor, the reflective electrode RE may also be connected to the drain electrode 124.

The reflective electrode RE may be separately formed in each pixel area.

The shapes of the plurality of metallic patterns MP and the reflective electrode RE will be described in more detail below.

The overcoat layer 160 may be disposed on the passivation layer 133 and the reflective electrode RE.

The overcoat layer 160 of the electroluminescent display device 100 according to the embodiment of the present disclosure may include a plurality of openings 160a.

The plurality of openings 160a may be formed to correspond to the plurality of protruding portions PP of the reflective electrode RE, respectively.

That is, the overcoat layer 160 may be formed on the reflective electrode RE corresponding to an area between adjacent metallic patterns MP, and the top surface of each of the plurality of protruding portions PP of the reflective electrode RE may be disposed at the opening 160a of the overcoat layer 160 and contact the first electrode 141.

Accordingly, the top surface of the reflective electrode RE which are exposed through the opening 160a and the top surface of the overcoat layer 160 may be formed to be flat without a stepped part. Namely, the exposed top surface of the reflective electrode RE may be flush with the top surface of the overcoat layer 160.

The overcoat layer 160 including the openings 160a, each of which is configured to expose the top surface of each of the plurality of protruding portions PP of the reflective electrode RE, may be formed through a process such as photolithography, wet etching, and dry etching.

The overcoat layer 160 may be formed of an organic material having a refractive index of about 1.5 to 1.55, but embodiments are not limited thereto.

The first electrode 141 may be disposed on the overcoat layer 160 and the reflective electrode RE which is exposed through the openings 160a.

The first electrode 141 disposed on the overcoat layer 160 and the reflective electrode RE which is exposed through the openings 160a may be formed to be flat and be separately formed in each subpixel area. However, embodiments are not limited thereto.

In this case, the first electrode 141 may be an anode or cathode for supplying one of electrons or holes to the light-emitting layer 142.

A case in which the first electrode 141 of the electroluminescent display device according to the embodiment of the present disclosure is an anode will be described as an example.

The first electrode 141 may include any one selected from the group consisting of indium tin oxide (ITO), indium zinc oxide (IZO), zinc tin oxide (ZTO), tin oxide (SnO2), zinc oxide (ZnO), indium oxide (In2O3), gallium indium tin oxide (GITO), indium gallium zinc oxide (IGZO), zinc indium tin oxide (ZITO), indium gallium oxide (IGO), gallium oxide (Ga2O3), aluminum zinc oxide (AZO), and gallium zinc oxide (GZO).

The first electrode 141 may contact the top surfaces of the plurality of protruding portions PP of the reflective electrode RE.

Accordingly, a micro cavity effect may be obtained in an area in which the first electrode 141 contacts the plurality of protruding portions PP of the reflective electrode RE.

The first electrode 141 may also be electrically connected to the light-emitting layer 142 by contacting the light-emitting layer 142 with a conductive material therebetween.

The first electrode 141 may have a refractive index of about 1.8 or higher, but embodiments are not limited thereto.

A bank layer 136 may be disposed on the overcoat layer 160 and the first electrode 141.

The bank layer 136 may include an open portion 136a exposing the first electrode 141.

The bank layer 136 may be disposed between adjacent pixel (or subpixel) areas and serve to differentiate the adjacent pixel (or subpixel) areas.

The bank layer 136 may be formed of a photo acrylic organic material having a refractive index of 1.6 or lower, but embodiments are not limited thereto.

The light-emitting layer 142 may be disposed on the first electrode 141 and the bank layer 136.

The light-emitting layer 142 may have a tandem white structure in which a plurality of light-emitting layers are stacked to emit white light.

For example, the light-emitting layer 142 may include a first light-emitting layer configured to emit blue light and a second light-emitting layer disposed on the first light-emitting layer and configured to emit light having a color which turns white when mixed with blue.

The second light-emitting layer may be a light-emitting layer configured to emit yellow-green light.

The light-emitting layer 142 may include only a light-emitting layer that emits one of blue light, red light, and green light.

The light-emitting layer 142 may be disposed in a shape which follows the morphology of the first electrode 141 in the emissive area EA.

That is, the light-emitting layer 142 may be formed to be flat in the emissive area EA.

The light-emitting layer 142 may be formed of an organic material having a refractive index of about 1.8 or higher, but embodiments are not limited thereto. The light-emitting layer 142 may also be formed of an inorganic luminescent material such as a quantum dot.

The second electrode 143 for supplying one of electrons or holes to the light-emitting layer 142 may be disposed on the light-emitting layer 142.

In this case, the second electrode 143 may be an anode or a cathode.

A case in which the second electrode 143 of the electroluminescent display device 100 according to an embodiment of the present disclosure is a cathode will be described as an example.

The second electrode 143 may be formed of a transparent conductive material (TCO) such as ITO and IZO or may be formed of a semi-transmissive conductive material such as magnesium (Mg), silver (Ag), or an alloy of Mg and Ag.

The second electrode 143 is disposed in a shape which follows the morphology of the light-emitting layer 142.

That is, the second electrode 143 may be formed to be flat in the emissive area EA.

The first electrode 141, the light-emitting layer 142, and the second electrode 143 form the light-emitting diode D.

An encapsulation layer (not shown) may be formed on the second electrode 143, and the electroluminescent display device 100 according to the embodiment of the present disclosure may be implemented by attaching a second substrate (not shown) and the encapsulation layer (not shown) of the first electrode 110.

Here, a color filter (not shown) and a black matrix (not shown) may be formed on the second substrate.

Figure 4:
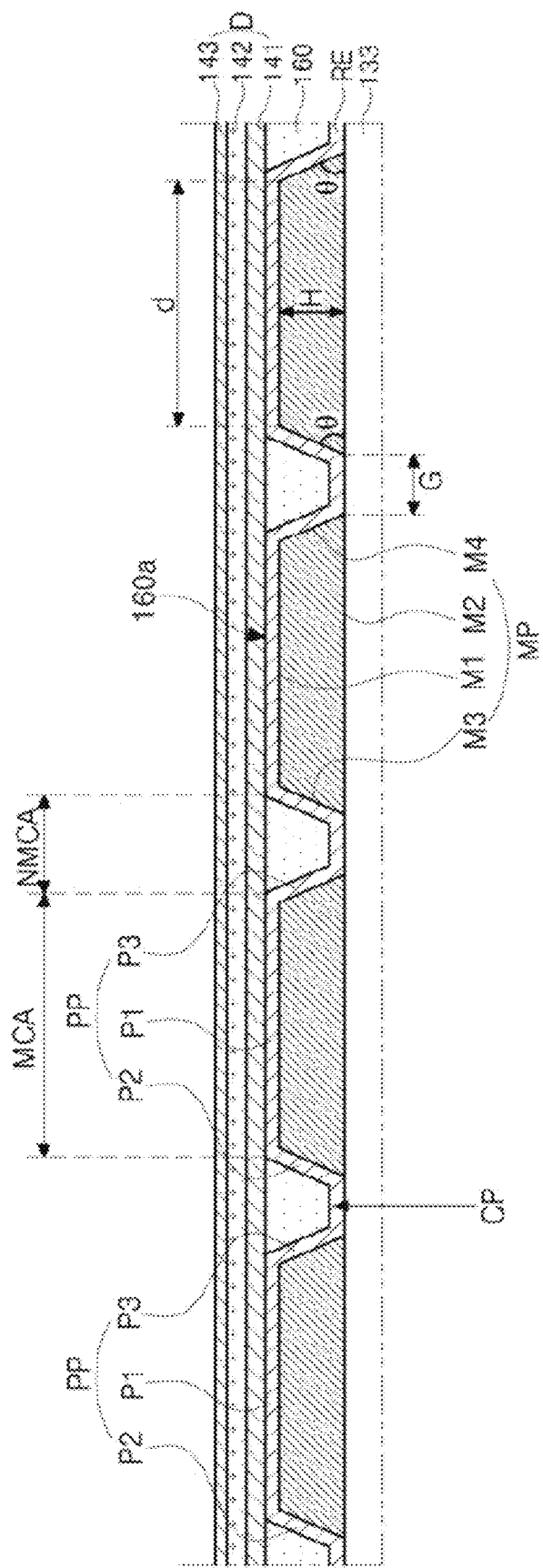
FIG. 4 is an enlarged view of portion A in FIG. 3.

FIG. 4 is an enlarged view of portion A in FIG. 3.

As illustrated in FIG. 4, in the electroluminescent display device 100 according to the embodiment of the present disclosure, the plurality of metallic patterns MP, the reflective electrode RE, the overcoat layer 160, the first electrode 141, the light-emitting layer 142, and the second electrode 143 may be disposed on the passivation layer 133.

That is, the plurality of metallic patterns MP, which are spaced apart from each other, may be disposed on the passivation layer 133 in the emissive area EA.

Here, each of the plurality of metallic patterns MP may include a first surface M1 contacting a top surface P1 of the protruding portion PP, a second surface M2 contacting the passivation layer 133, and first and second inclined surfaces M3 and M4 connecting the first surface M1 and the second surface M2.

Here, the first surface M1 and the second surface M2 may be formed to be flat, and an area of the second surface M2 may be greater than an area of the first surface M1.

An angle θ formed between the second surface M2 and each of the first and second inclined surfaces M3 and M4 may be an acute angle.

The acute angle may be in a range of 20° to 70°, but embodiments are not limited thereto.

That is, each of the plurality of metallic patterns MP may have a trapezoidal cross-section, but embodiments are not limited thereto.

In addition, the plurality of metallic patterns MP may be disposed at a distance G from each other.

Accordingly, the passivation layer 133 may be exposed in an area in which the plurality of metallic patterns MP is spaced apart from each other. Namely, the passivation layer 133 may be exposed in an area between adjacent metallic patterns MP.

The distance G at which the plurality of metallic patterns MP are spaced apart from each other may be in a range of 0.5 μm to 2 μm, but embodiments are not limited thereto.

A length d of the first surface M1 of each of the plurality of metallic patterns MP may be in a range of 1 μm to 5 μm, but embodiments are not limited thereto.

Further, a height H of each of the plurality of metallic patterns MP may be in a range of 0.5 μm to 1 μm, but embodiments are not limited thereto.

The height H of the metallic pattern MP refers to a distance between the first surface M1 and the second surface M2.

Each of the plurality of metallic patterns MP may be formed of a single layer or multiple layers formed of Cu, M, Ti, or an alloy thereof, but embodiments are not limited thereto.

In the electroluminescent display device 100 according to the embodiment of the present disclosure, the reflective electrode RE may be disposed conforming to the shapes of the plurality of metallic patterns MP and the top surface of the passivation layer 133.

That is, the reflective electrode RE may include the plurality of protruding portions PP and connecting portions CP connecting the plurality of protruding portions PP along the shapes of the plurality of metallic patterns MP and the top surface of the passivation layer 133.

Each of the plurality of protruding portions PP may include a top surface P1 contacting the first electrode 141 and side surfaces P2 and P3 connecting the top surface P1 and the connecting portion CP. In certain embodiments of the present disclosure, the top surface P1 and side surfaces P2 and P3 of each protruding portions PP may refer to a top surface section P1 and side surface sections P2 and P3, respectively, and may be considered to be interchangeable with each other, instead of a merely surface.

The side surfaces P2 and P3 may have a predetermined slope.

The connecting portions CP may be disposed between the plurality of protruding portions PP and be in contact with the passivation layer 133.

The top surface P1 of each of the plurality of protruding portions PP and the connecting portions CP may be formed to be flat. That is, in the reflective electrode RE, flat top surfaces P1 and flat connecting portions CP, which have different heights, may be alternately disposed.

As described above, in the electroluminescent display device 100 of FIG. 3 according to the embodiment of the present disclosure, by disposing the plurality of metallic patterns MP, which are spaced apart from each other, on the passivation layer 133 and forming the reflective electrode RE configured to cover the passivation layer 133 and the plurality of metallic patterns MP, the reflective electrode RE may be formed in such a way that the flat top surfaces P1 of the protruding portions PP and the flat connecting portions CP, which have different heights, are alternately disposed, and the inclined side surfaces P2 and P3 are disposed to connect the flat top surfaces P1 of the protruding portions PP and the flat connecting portions CP.

In addition, the overcoat layer 160 may be disposed on the passivation layer 133 and the reflective electrode RE.

In this case, the overcoat layer 160 of the electroluminescent display device 100 of FIG. 3 according to the embodiment of the present disclosure may include the opening 160a configured to expose the top surface P1 of each of the plurality of protruding portions PP of the reflective electrode RE.

That is, by filling spaces between the plurality of protruding portions PP of the reflective electrode RE with the overcoat layer 160, the reflective electrode RE and the first electrode 141 are electrically connected to each other through the opening 160a of the overcoat layer 160 while the overcoat layer 160 flattens upper portions of the passivation layer 133 and the reflective electrode RE.

The overcoat layer 160 may be formed of an organic material having a refractive index of about 1.5 to 1.55, but embodiments are not limited thereto.

The first electrode 141 may be disposed on the reflective electrode RE and the overcoat layer 160.

The first electrode 141 may be formed of an amorphous metal oxide having a refractive index of about 1.8 or higher, but embodiments are not limited thereto.

The first electrode 141 may be disposed to be flat on the reflective electrode RE and the overcoat layer 160.

Therefore, the first electrode 141 may contact the top surfaces P1 of the plurality of protruding portions PP of the reflective electrode RE and may not contact the side surfaces P2 and P3 and the connecting portions CP of the reflective electrode RE.

Accordingly, a micro cavity phenomenon may occur in an area in which the first electrode 141 contacts the top surfaces P1 of the plurality of protruding portions PP of the reflective electrode RE.

The micro cavity phenomenon refers to varying an emission spectrum through repeated reflection of light by suitably adjusting thicknesses of respective electrodes and the light-emitting layer 142 in the light-emitting diode D, which includes the reflective electrode RE, the first electrode 141 (anode), the light-emitting layer, and the second electrode 143 (cathode).

The light-emitting layer 142 may be disposed on the first electrode 141, and the light-emitting layer 142 may be formed to be flat in the emissive area EA of FIG. 3.

The light-emitting layer 142 may be formed of an organic material having a refractive index of about 1.8 or higher, but embodiments are not limited thereto. The light-emitting layer 142 may also be formed of an inorganic luminescent material such as a quantum dot.

The second electrode 143 may be disposed on the light-emitting layer 142, and the second electrode 143 may be formed to be flat in the emissive area EA of FIG. 3.

As described above, the first electrode 141, the light-emitting layer 142, and the second electrode 143 form the light-emitting diode D.

The light-emitting diode D may be formed to be flat in the emissive area EA.

Through such a structure, in the electroluminescent display device 100 of FIG. 3 according to the embodiment of the present disclosure, light extraction efficiency and color gamut may be improved using the micro cavity phenomenon in a micro cavity area MCA in which the first electrode 141 contacts the top surfaces P1 of the plurality of protruding portions PP of the reflective electrode RE.

In a non-micro cavity area NMCA, which is an area corresponding to the side surfaces P2 and P3 of the plurality of protruding portions PP and the connecting portions CP of the reflective electrode RE that do not contact the first electrode 141 and in which the micro cavity phenomenon does not occur, light, which has been unable to be output to the outside due to being totally reflected inside the light-emitting diode D, may be reflected upward so as to be extracted to the outside. In this way, light extraction efficiency may be further improved. Particularly, in the non-micro cavity area NMCA, since the straightness of light is decreased due to the shape of the reflective electrode RE and light is output in a lateral direction, a phenomenon, in which luminance decreases and a color shift occurs from a color with a long wavelength to a color with a short wavelength as a viewing angle increases in the related art electroluminescent display device to which the micro cavity effect is applied, may be effectively prevented.

Figure 5:
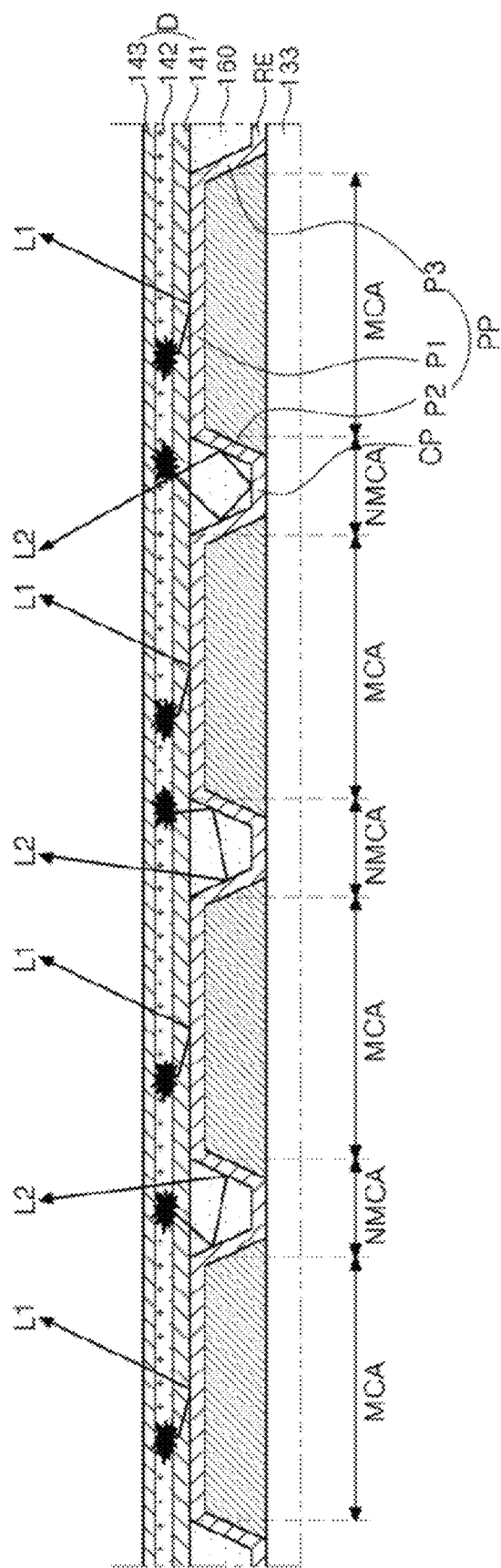
FIG. 5 is a view schematically illustrating an optical path of the electroluminescent display device according to the embodiment of the present disclosure.

FIG. 5 is a view schematically illustrating an optical path of the electroluminescent display device according to the embodiment of the present disclosure. Description will be given with reference to FIGS. 4 and 5.

As illustrated in FIG. 5, the electroluminescent display device 100 of FIG. 3 according to the embodiment of the present disclosure may include a non-micro cavity area NMCA, which corresponds to the side surfaces P2 and P3 and the connecting portions CP of the reflective electrode RE that do not contact the first electrode 141, disposed between a micro cavity area MCA and another micro cavity area MCA in which the first electrode 141 contacts the top surfaces P1 of the plurality of protruding portions PP of the reflective electrode RE.

Light L1 which is output to the outside using the micro cavity phenomenon in the micro cavity area MCA and light L2 which is output upward by being reflected through the side surfaces P2 and P3 and the connecting portions CP of the reflective electrode RE in the non-micro cavity area NMCA may be mixed so that a viewing angle is widened while light extraction efficiency is improved.

That is, since the straightness of light output is decreased due to the shape of the reflective electrode RE and light is output in a lateral direction in the non-micro cavity area NMCA, the phenomenon, in which luminance decreases and a color shift occurs from a color with a long wavelength to a color with a short wavelength as a viewing angle increases in the related art electroluminescent display device to which the micro cavity effect is applied, may be effectively prevented.

Figure 6A:
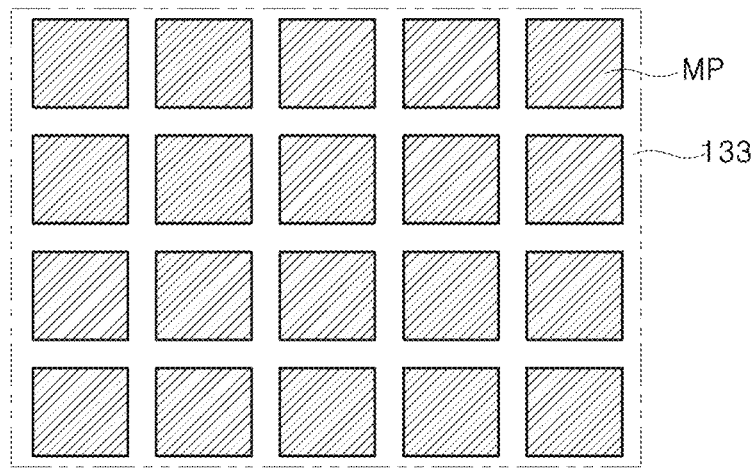
FIGS. 6A to 6C are plan views schematically illustrating metallic patterns of the electroluminescent display device according to the embodiment of the present disclosure.
Figure 6B:
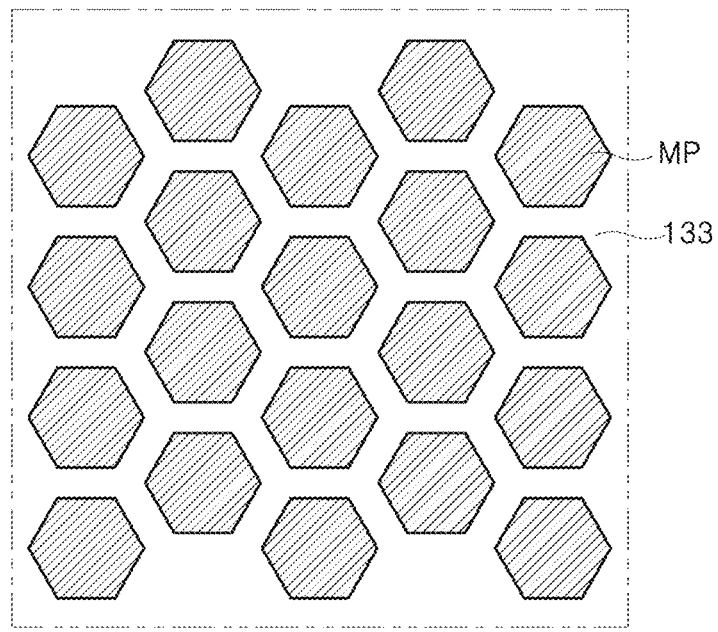
Figure 6C:
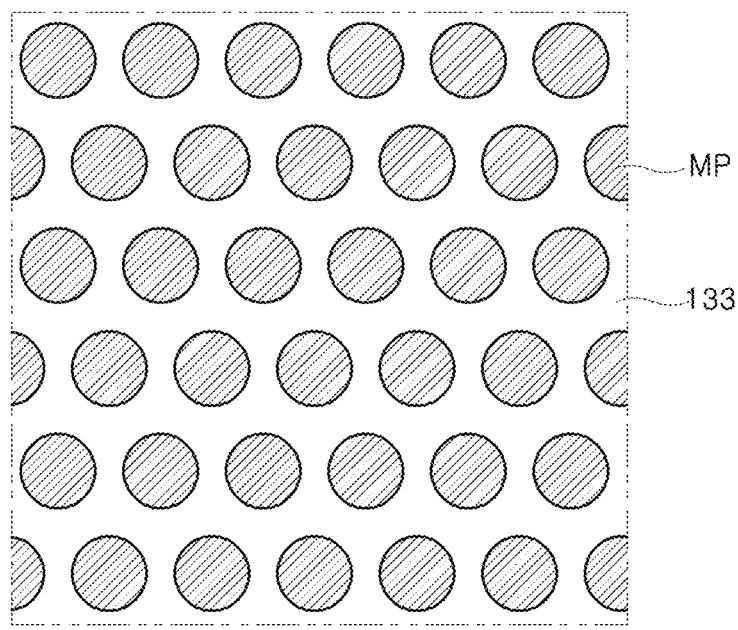

FIGS. 6A to 6C are plan views schematically illustrating metallic patterns of the electroluminescent display device according to the embodiment of the present disclosure.

As illustrated in FIGS. 6A to 6C, in the electroluminescent display device 100 of FIG. 3 according to the embodiment of the present disclosure, a plurality of metallic patterns MP may be disposed on the passivation layer 133.

That is, as illustrated in FIG. 6A, each of the plurality of metallic patterns MP may have a quadrilateral shape in plan view, each of the plurality of metallic patterns MP may be disposed to be spaced apart from each other, and the passivation layer 133 may be exposed in a space between adjacent metallic patterns MP.

As illustrated in FIG. 6B, each of the plurality of metallic patterns MP may have a hexagonal shape in plan view, each of the plurality of metallic patterns MP may be disposed to be spaced apart from each other, and the passivation layer 133 may be exposed in a space between adjacent metallic patterns MP.

As illustrated in FIG. 6C, each of the plurality of metallic patterns MP may have a circular shape in plan view, each of the plurality of metallic patterns MP may be disposed to be spaced apart from each other, and the passivation layer 133 may be exposed in a space between adjacent metallic patterns MP.

Shapes in plan view of the plurality of metallic patterns MP illustrated in FIGS. 6A to 6C are merely examples, and embodiments are not limited thereto. The plurality of metallic patterns MP may have various other shapes in plan view.

FIGS. 7A to 7D are views schematically illustrating optical paths in accordance with a distance between the plurality of metallic patterns in the electroluminescent display device according to the embodiment of the present disclosure. Description will be given with reference to FIG. 4 and FIGS. 7A to 7D.

In FIGS. 7A to 7D, it is shown that an angle θ formed between the second surface M2 and the first inclined surface M3 and an angle θ formed between the second surface M2 and the second inclined surface M4 of each of the plurality of metallic patterns MP of the electroluminescent display device 100 of FIG. 3 are equal, i.e., 30°, and optical paths in accordance with changes in the distance G between the plurality of metallic patterns MP are illustrated.

Figure 7A:
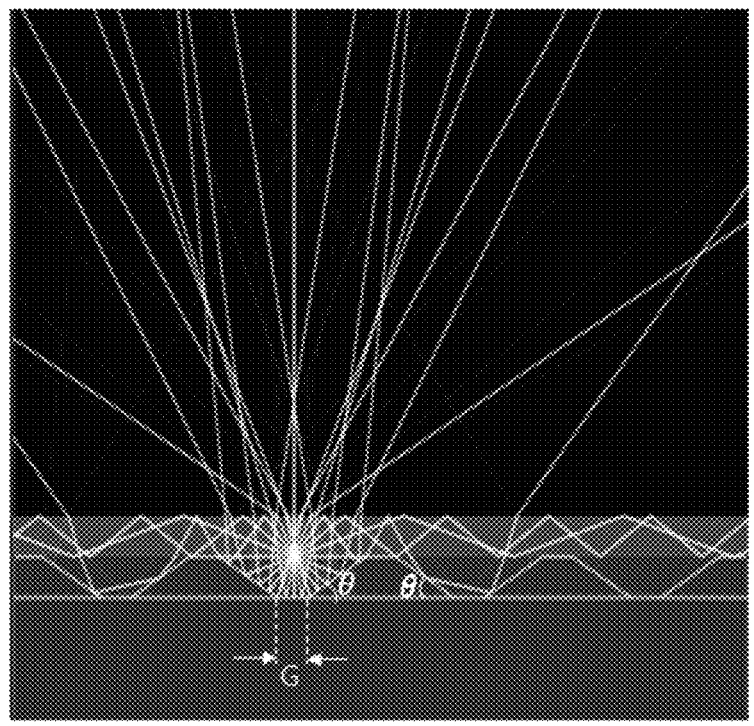
FIGS. 7A to 7D are views schematically illustrating optical paths in accordance with a distance between the plurality of metallic patterns of the electroluminescent display device according to the embodiment of the present disclosure.
Figure 7B:
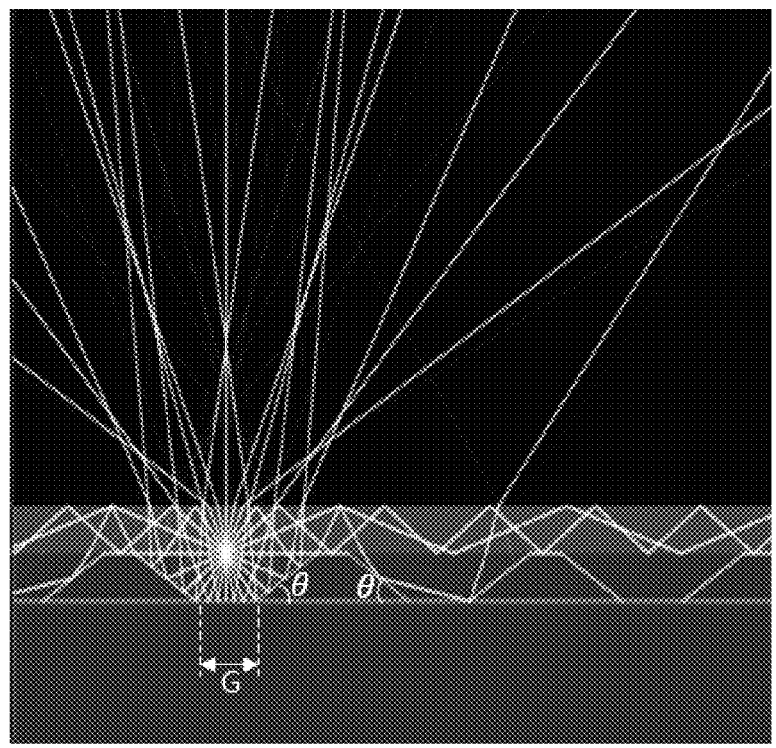
Figure 7C:
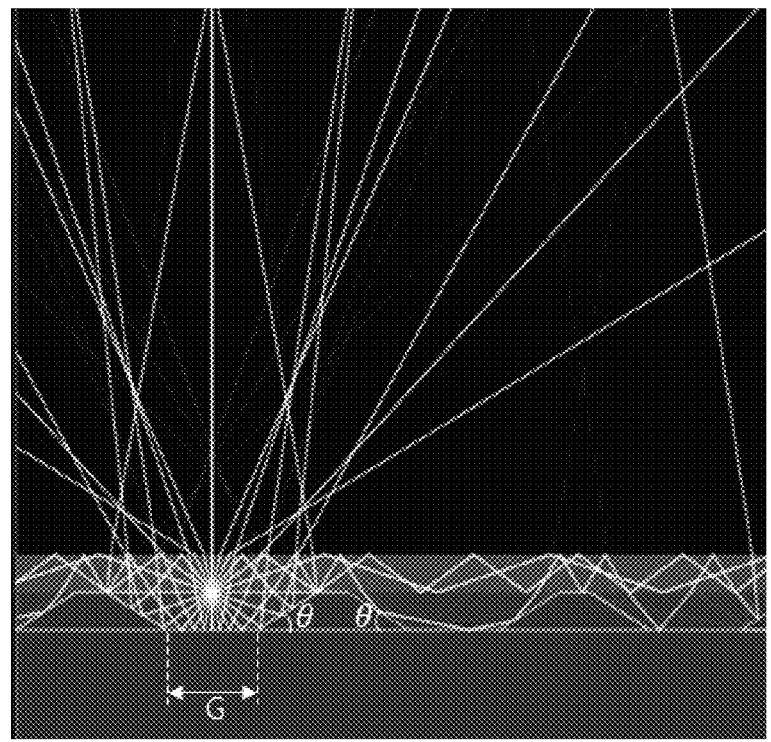
Figure 7D:
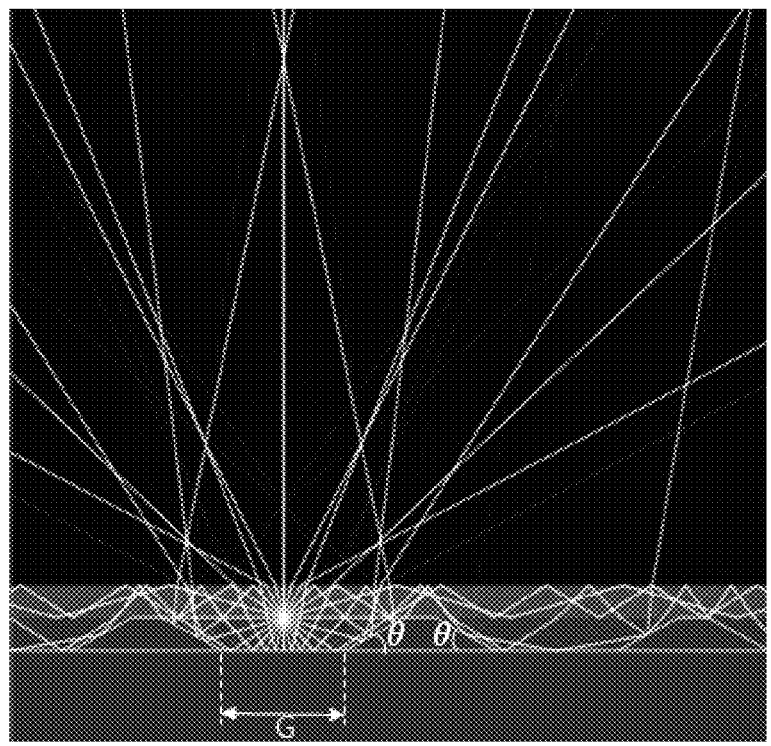

FIG. 7A illustrates an optical path in a case in which the distance G between the plurality of metallic patterns MP is 0.5 μm, FIG. 7B illustrates an optical path in a case in which the distance G between the plurality of metallic patterns MP is 1 μm, FIG. 7C illustrates an optical path in a case in which the distance G between the plurality of metallic patterns MP is 1.5 μm, and FIG. 7D illustrates an optical path in a case in which the distance G between the plurality of metallic patterns MP is 2 μm.

Comparing FIGS. 7A to 7D, it can be recognized that light extraction efficiency is the highest in the case shown in FIG. 7C in which the distance G between the plurality of metallic patterns MP is 1.5 μm.

That is, in a non-micro cavity area NMCA, which is an area corresponding to the side surfaces P2 and P3 of the plurality of protruding portions PP and the connecting portions CP of the reflective electrode RE that do not contact the first electrode 141, an amount of light, which has been unable to be output to the outside due to being totally reflected inside the light-emitting diode D, that is reflected upward through shapes of the connecting portions CP of the reflective electrode RE and extracted to the outside may be the greatest.

Also, by forming the micro cavity area and the non-micro cavity area to have a ratio in a range of 1:1 to 5:1, and preferably, 1:1, the phenomenon in which luminance decreases and the color shift occurs in accordance with a change in a viewing angle may be improved while light extraction efficiency is improved.

Accordingly, in the electroluminescent display device 100 of FIG. 3 according to the embodiment of the present disclosure, light extraction efficiency may be further improved when the distance G between the plurality of metallic patterns MP is 1.5 μm.

Figure 8A:
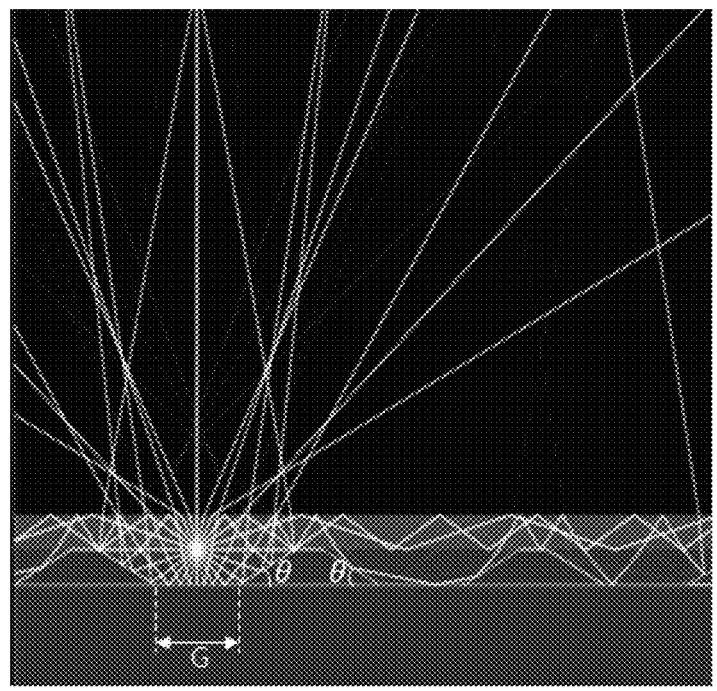
FIGS. 8A to 8C are views schematically illustrating optical paths in accordance with an angle between a second surface and each of first and second inclined surfaces of each metallic pattern of the electroluminescent display device according to the embodiment of the present disclosure.
Figure 8B:
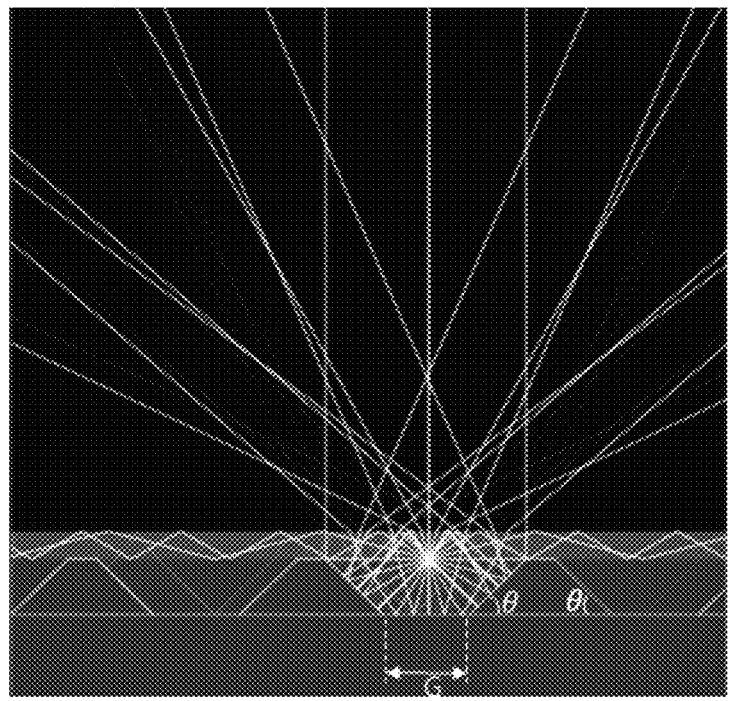
Figure 8C:
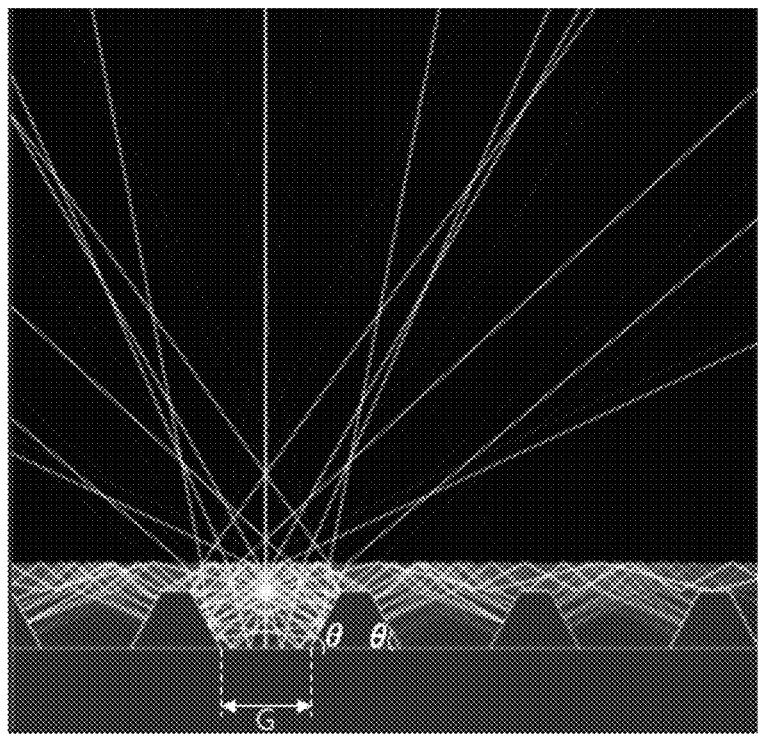

FIGS. 8A to 8C are views schematically illustrating optical paths in accordance with an angle between a second surface and each of first and second inclined surfaces of each metallic pattern of an electroluminescent display device according to the embodiment of the present disclosure. Description will be given with reference to FIG. 4 and FIGS. 8A to 8D.

FIG. 8A illustrates an optical path in a case in which an angle θ formed between the second surface M2 and each of the first and second inclined surfaces M3 and M4 of each metallic pattern MP is 30°, FIG. 8B illustrates an optical path in a case in which an angle θ formed between the second surface M2 and each of the first and second inclined surfaces M3 and M4 of each metallic pattern MP is 45°, and FIG. 8C illustrates an optical path in a case in which an angle θ formed between the second surface M2 and each of the first and second inclined surfaces M3 and M4 of each metallic pattern MP is 60°.

Comparing FIGS. 8A to 8C, it can be recognized that light extraction efficiency is high in the cases shown in FIGS. 8A and 8B in which the angle θ formed between the second surface M2 and each of the first and second inclined surfaces M3 and M4 of each metallic pattern MP is 30° and 45°. It can be recognized that light extraction efficiency is somewhat decreased when the angle θ formed between the second surface M2 and each of the first and second inclined surfaces M3 and M4 of each metallic pattern MP is 60°.

That is, in the cases in which the angle θ formed between the second surface M2 and each of the first and second inclined surfaces M3 and M4 of each metallic pattern MP is 30° and 45° in a non-micro cavity area NMCA, which is an area corresponding to the side surfaces P2 and P3 of the plurality of protruding portions PP and the connecting portions CP of the reflective electrode RE that do not contact the first electrode 141, an amount of light, which has been unable to be output to the outside due to being totally reflected inside the light-emitting diode D, that is reflected upward and extracted to the outside may be the greatest.

Therefore, in the electroluminescent display device 100 of FIG. 3 according to the embodiment of the present disclosure, light extraction efficiency may be further improved when the angle θ between the second surface M2 and each of the first and second inclined surfaces M3 and M4 of each of the plurality of metallic patterns MP is formed to be in a range of 30° to 45°.

As described above, in the electroluminescent display device 100 of FIG. 3 according to the embodiment of the present disclosure, light extraction efficiency and color reproduction rate may be improved using the micro cavity phenomenon in the micro cavity area MCA in which the first electrode 141 contacts the top surfaces P1 of the plurality of protruding portions PP of the reflective electrode RE.

Further, in the non-micro cavity area NMCA corresponding to the side surfaces P2 and P3 of the plurality of protruding portions PP and the connecting portions CP of the reflective electrode RE that do not contact the first electrode 141, a viewing angle may be widened due to mixing of the light L1 of FIG. 5 output from the micro-cavity area MCA and the light L2 of FIG. 5 output from the non-micro cavity area, while light extraction efficiency is further improved due to upward reflection of light, which has been unable to be output to the outside due to being totally reflected inside the light-emitting diode D, so that the light may be extracted to the outside.

That is, since the straightness of light output is decreased due to the shape of the reflective electrode RE and light is output in a lateral direction in the non-micro cavity area NMCA, the phenomenon, in which luminance decreases and a color shift occurs from a color with a long wavelength to a color with a short wavelength due to an increase in a viewing angle, which occurs in the related art electroluminescent display device to which the micro cavity effect is applied, may be effectively prevented.

Particularly, by forming the distance G between the plurality of metallic patterns MP to be 1.5 μm and forming the angle θ formed between the second surface M2 and each of the first and second inclined surfaces M3 and M4 of each of the plurality of metallic patterns MP to be in a range of 30° to 45°, the phenomenon in which luminance decreases and a color shift occurs due to an increase in a viewing angle may be more effectively prevented.

In the present disclosure, by disposing a plurality of metallic patterns to be spaced apart from each other under a light-emitting diode and forming a reflective electrode configured to cover the plurality of metallic patterns, a viewing angle can be widened while light extraction efficiency is improved.

The present disclosure has been described above with reference to exemplary embodiments thereof. However, those of ordinary skill in the art should understand that various modifications and changes may be made to the present disclosure within the scope not departing from the technical spirit and scope of the present disclosure described in the claims below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to [insert list], are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate including one or more pixels; and
a light-emitting structure disposed in each of the pixels, wherein the light-emitting structure comprises a second electrode, a reflective electrode, and a light-emitting layer disposed between the second electrode and the reflective electrode, or comprises a second electrode, a reflective electrode, a light-emitting layer disposed between the second electrode and the reflective electrode, and wherein the light-emitting structure further comprises a first electrode disposed between the light-emitting layer and the reflective electrode,
wherein each of the pixels comprises a plurality of micro cavity areas disposed to be spaced apart from each other and one or more non-micro cavity area disposed between the micro cavity area, a combined thickness in a vertical direction of the light-emitting structure from the reflective electrode to the second electrode has a different value in the micro cavity area from that in the non-micro cavity area, and the light-emitting structure is configured to produce a micro cavity effect, and
wherein each of the second electrode and the reflective electrode is formed to be flat in the micro cavity area and at least one of the second electrode and the reflective electrode is formed to comprise a non-flat surface in the non-micro cavity area or wherein each of the first electrode, the second electrode, and the reflective electrode is formed to be flat in the micro cavity area and at least one of the first electrode, the second electrode, and the reflective electrode is formed to comprise a non-flat surface in the non-micro cavity area.

2. The electroluminescent display device of claim 1, wherein the combined thickness in a vertical direction of the light-emitting structure from the reflective electrode to the second electrode has a smaller value in the micro cavity area than that in the non-micro cavity area.

3. The electroluminescent display device of claim 1, wherein each of the plurality of micro cavity areas is formed to have a circular, rectangular, square, diamond, hexagonal or other polygonal shape disposed to be spaced apart from each other in one or each pixel.

4. The electroluminescent display device of claim 1, wherein the reflective electrode includes an inclined surface towards the light-emitting layer in the non-micro cavity area.

5. The electroluminescent display device of claim 1, wherein each of the plurality of micro cavity areas has a length in a lateral direction of the substrate in a range of 1 μm to 5 μm.

6. The electroluminescent display device of claim 4, wherein the reflective electrode comprises, towards the light-emitting layer, at least two inclined surfaces and one flat surface parallel to the light-emitting layer in the micro cavity area.

7. The electroluminescent display device of claim 6, wherein the flat surface of the reflective electrode in the micro cavity area has a length in a range of 1 μm to 5 μm.

8. The electroluminescent display device of claim 6, wherein an angle formed between the inclined surface and a lateral direction of the substrate is in a range of 20° to 70°.

9. The electroluminescent display device of claim 1, further comprising:
a passivation layer disposed on a side of the reflective electrode opposite to the first electrode;
a plurality of metallic patterns disposed to be spaced apart from each other between the reflective electrode and the passivation layer; and
an overcoat layer disposed between the first electrode and the reflective electrode.

10. The electroluminescent display device of claim 9, wherein each of the plurality of metallic patterns includes a first surface in the micro cavity area contacting a top surface section of the reflective electrode, a second surface contacting the passivation layer and having an area greater than that of the first surface, and first and second inclined surfaces connecting the first surface and the second surface.

11. The electroluminescent display device of claim 9, wherein a distance between adjacent two of the plurality of metallic patterns is in a range of 0.5 μm to 2 μm.

12. The electroluminescent display device of claim 9, wherein a height of the plurality of metallic patterns is in a range of 0.5 μm to 1 μm.

13. The electroluminescent display device of claim 10, wherein a length of the first surface is in a range of 1 μm to 5 μm.

14. The electroluminescent display device of claim 10, wherein an angle formed between the second surface and each of the first and second inclined surfaces is in a range of 20° to 70°.

* * * * *

UNITED STATES PATENT AND TRADEMARK OFFICE
CERTIFICATE OF CORRECTION

| | | |
|---|---|---|
| PATENT NO. | : 11,152,598 B2 | Page 1 of 1 |
| APPLICATION NO. | : 16/905799 | |
| DATED | : October 19, 2021 | |
| INVENTOR(S) | : Yong-Hoon Choi et al. | |

It is certified that error appears in the above-identified patent and that said Letters Patent is hereby corrected as shown below:

In the Specification

Column 13, Lines 40-41:
"Application data Sheet, including but not limited to [insert list], are incorporated herein by reference," should read: -- Application Data Sheet are incorporated herein by reference, --.

Signed and Sealed this
Third Day of January, 2023

Katherine Kelly Vidal
*Director of the United States Patent and Trademark Office*